United States Patent [19]
Matsuura

[11] Patent Number: 6,124,766
[45] Date of Patent: Sep. 26, 2000

[54] FREQUENCY CONVERTER CIRCUIT FOR CABLE MODEM TUNER

[75] Inventor: Syuuji Matsuura, Ikoma, Japan

[73] Assignee: Sharp Kabushiki Kaisha, Osaka, Japan

[21] Appl. No.: 09/199,465

[22] Filed: Nov. 25, 1998

[30] Foreign Application Priority Data

Nov. 28, 1997 [JP] Japan ................................ 9-327635

[51] Int. Cl.[7] .............. H03B 1/04; H03B 5/12; H03D 7/00; H04B 1/28
[52] U.S. Cl. .............. 331/117 R; 331/105; 331/175; 331/177 V; 331/179; 331/181; 329/306; 455/318
[58] Field of Search .................. 331/37, 40, 41, 331/105, 116 R, 116 FE, 116 M, 117 R, 117 FE, 117 D, 175, 177 V, 179, 181; 455/318–320; 329/304–310

[56] References Cited

U.S. PATENT DOCUMENTS

| | | |
|---|---|---|
| 4,492,934 | 1/1985 | Sugimoto . |
| 5,418,500 | 5/1995 | Igarashi ........................ 331/76 |
| 5,745,013 | 4/1998 | Hohmann . |

FOREIGN PATENT DOCUMENTS

| | | |
|---|---|---|
| 0351153-A1 | 1/1990 | European Pat. Off. . |
| 0708562-A2 | 4/1996 | European Pat. Off. . |
| 5-176327 | 7/1993 | Japan . |
| 7-162231 | 6/1995 | Japan . |
| 95/33307 | 12/1995 | WIPO . |

*Primary Examiner*—David Mis

[57] ABSTRACT

A local oscillation circuit in a frequency converter circuit includes a resonant circuit, and a differential amplifier circuit connected to the resonant circuit. The differential amplifier circuit includes two transistors constituting a differential stage. One end of the resonant circuit is connected to the base of one transistor via a capacitive element, and to the collector of the other transistor via a capacitive element. The other end of the resonant circuit is connected to only the base of the other transistor via a capacitive element. Accordingly, an unbalanced oscillate operation is performed in the local oscillation circuit, leading to reduction of the phase noise caused by decrease in an oscillation output due to the trap phenomenon, and an improvement in reception quality.

4 Claims, 7 Drawing Sheets

FREQUENCY CONVERTER CIRCUIT FOR CABLE MODEM TUNER

BACKGROUND OF THE INVENTION

1. Field of the Invention

The present invention relates to a frequency converter circuit provided to a tuner contained in a cable modem (referred to as "cable modem tuner" hereinafter) which is necessary for high-speed data communication utilizing any vacant channel of the cable television (referred to as "CATV" hereinafter). More particularly, the present invention relates to a frequency converter circuit applied to a cable modem tuner that can properly maintain the characteristics of high-frequency signals.

2. Description of the Background Art

The CATV is now introducing HFC (abbreviation for Hybrid Fiber/Coax) constituted by employing the coaxial cable as the house drop line and employing the optical fiber as the trunk line network. The HFC is employed for providing data communication service with a broad band of several M bits per second to each domestic site. A high-speed data line of the transmission rate of 30 M bits/second with a bandwidth of 6 MHz can be implemented even by the 64 QAM (abbreviation for Quadrature Amplitude Modulation) which is not regarded as high technology now. By utilizing any vacant channel of CATV, high-speed data communication of 4 M bits/sec to 27 M bits/sec is possible. In order to realize such high-speed data communication, a cable modem is required that has a main function of converting transmission signals to those signals used by domestic data processing equipment and vice versa.

FIG. 6 is a block diagram of a conventional cable modem tuner 100. Referring to FIG. 6, cable modem tuner 100 includes an input terminal IN for connecting a CATV station 300 with cable modem tuner 100 via a cable 400 for communication, a data terminal D for inputting data signals modulated by the quadrature phase-shift keying by an external QPSK (Quadrature Phase-Shift Keying) modulator 500, an output terminal OUT for outputting processed IF (abbreviation for Intermediate Frequency) signals, an IF filter 101, a switching circuit 102, first tuning circuits 103–105, high-frequency amplifier circuits 106–108, second tuning circuits 109–111, a VHF.HIGH/LOW switching circuit 112, frequency converter circuits 113 and 114, a PLL (abbreviation for Phase-Locked Loop) channel select circuit 115, an IF first amplifier circuit 116, an SAW filter 117, an IF second amplifier circuit 118, and an upstream circuit 119.

As for CATV signals related to the cable modem tuner, generally upstream signals (signals transmitted from the cable modem tuner to the CATV station) are operated at 5–42 MHz, and downstream signals (signals transmitted from the CATV station to the cable modem tuner) are operated at 54–860 MHz.

In operation, a data signal applied via data input terminal D is transmitted via upstream circuit 119 to be output from input terminal IN toward CATV station 300. Upstream circuit 119 is a low-pass filter having the passband of 5–42 MHz.

A signal transmitted from CATV station 300 is input to the cable modem (cable modem tuner 100) via input terminal IN. Processing of the downstream signals in cable modem tuner 100 is hereinafter described.

A downstream signal supplied from input terminal IN is passed through IF filter 101, and transmitted, by switching circuit 102, to any one of circuitry 201 for receiving a UHF band (470–860 MHz) (hereinafter referred to as "UHF band circuit"), circuitry 202 for receiving a VHF.HIGH band (170–470 MHz) (hereinafter referred to as "VHF.HIGH band circuit"), and circuitry 203 for receiving a VHF.LOW band (54–170 MHz) (hereinafter referred to as "VHF.LOW band circuit") (i.e. to any band circuit corresponding to a desired reception channel). IF filter 101 is a high-pass filter having the attenuation band of 5–46 MHz and the passing band of 54 MHz and above.

One of UHF band circuit 201, VHF.HIGH band circuit 202, and VHF.LOW band circuit 203 is selected according to a desired reception channel. Only the selected band circuit is in an operating state, and other band circuits that are not selected are in a non-operating state. For example, when a channel of the UHF band is received, UHF band circuit 201, i.e., first tuning circuit 103, high-frequency amplifier circuit 106, second tuning circuit 109, and frequency converter circuit 113 are in the operating state, and VHF.HIGH band circuit 202 and VHF.LOW band circuit 203, i.e., first tuning circuits 104 and 105, high-frequency amplifier circuits 107 and 108, second tuning circuits 110 and 111, VHF.HIGH/LOW switching circuit 112, and frequency converter circuit 114 are in the non-operating state.

Those circuits common to respective band circuits such as IF filter 101, switching circuit 102, PLL channel select circuit 115, IF first amplifier circuit 116, SAW filter 117, IF second amplifier circuit 118, and upstream circuit 119 are always in the operating state. VHF.HIGH/LOW switching circuit 112 and frequency converter circuit 114 are common to VHF.HIGH band circuit 202 and VHF.LOW band circuit 203, and these circuits are in the non-operating state only when a channel of the UHF band is received.

An operation in UHF band circuit 201, VHF.HIGH band circuit 202 and VHF.LOW band circuit 203 is now described. A signal received via input terminal IN, IF filter 101 and switching circuit 102 is supplied to one of the first tuning circuits 103–105. The received signal is output from the one of the first tuning circuits 103–105 as a signal of a desired frequency, amplified by a corresponding one of high-frequency amplifier circuits 106–108 in the next stage, and thereafter supplied to a corresponding one of the second tuning circuits 109–111. The supplied signal is input to the corresponding one of the second tuning circuits 109–111 and output therefrom again as a signal of the desired frequency to be supplied to a corresponding one of frequency converter circuits 113 and 114.

Frequency converter circuits 113 and 114 are respectively constituted of respective mixer circuits 51 and 61 and respective local oscillation circuits 52 and 62. From the corresponding one of frequency converter circuits 113 and 114, an IF signal obtained by mixing the high frequency signal supplied from the corresponding one of the second tuning circuits 109–111 with an oscillation signal from a corresponding one of local oscillation circuits 52 and 62 using a corresponding one of mixer circuits 51 and 61 is output. In other words, the high-frequency signal output from second tuning circuits 109–111 is converted to the IF signal by frequency converter circuits 113 and 114. The oscillation frequency of local oscillation circuits 52 and 62 each is controlled by PLL channel select circuit 115. Frequency converter circuits 113 and 114, and PLL channel select circuit 115 are formed as an IC of one chip.

The IF signal is thus output from the corresponding one of UHF band circuit 201, VHF.HIGH band circuit 202 and VHF.LOW band circuit 203, amplified by IF first amplifier circuit 116, then amplified again by IF second amplifier circuit 118 via SAW filter 117, and output from output terminal OUT.

FIG. 7 shows a conventional circuit structure of frequency converter circuit 114 illustrated in FIG. 6. In cable modem tuner 100, frequency converter circuit 114 which is common to VHF.HIGH band circuit 202 and VHF.LOW band circuit 203 has the structure illustrated in FIG. 7. Referring to FIG. 7, an IC13 is connected to a resonant circuit 41 connecting terminals T5–T7 via feedback capacitors 14–17 that are described in the following.

IC13 includes a differential amplifier circuit 42, mixer circuits 1 and 2 that constitute mixer circuit 61, buffer amplifiers 3 and 4, terminals T1 and T2 for input and terminals T3 and T4 for output to and from mixer circuits 1 and 2, and a terminal T8 to apply power supply voltage VCC.

Differential amplifier circuit 42 includes transistors 51 and 52 that constitute a differential stage, bias resistors 7, 8, 10 and 11, collector resistors 6 and 12, and an emitter resistor 9.

Power supply voltage VCC applied to terminal T8 is divided by bias resistors 7 and 8 and bias resistors 10 and 11 to be supplied to the bases of transistors 51 and 52 respectively that constitute the differential stage. Power supply voltage VCC applied to terminal T8 is also supplied to the collectors of transistors 51 and 52 via collector resistors 6 and 12 respectively. The emitters of transistors 51 and 52 are commonly grounded via emitter resistor 9. The bases of transistors 51 and 52 are respectively connected to the input stages of respective mixer circuits 1 and 2 via buffer amplifiers 3 and 4.

Resonant circuit 41 and differential amplifier circuit 42 within IC13 are connected as follows. One end of resonant circuit 41 is connected to the base of transistor 51 via feedback capacitor 14, and to the collector of transistor 52 via feedback capacitor 15. The other end of resonant circuit 41 is connected to the collector of transistor 51 via feedback capacitor 16, and to the base of transistor 52 via feedback capacitor 17.

In operation, change of the bias voltage upon application of the supply voltage causes signals oscillating at the resonance frequency (100–500 MHz) of resonant circuit 41 because of a balanced oscillate operation in local oscillation circuit 62 to be applied to mixer circuits 1 and 2 in reversed phases relative to each other. Accordingly, high-frequency signals of VHF supplied from VHF.HIGH/LOW switching circuit 112 via terminals T1 and T2 are converted to IF signals by mixer circuits 1 and 2 to be output from terminals T3 and T4 respectively. The IF signals output from terminals T3 and T4 respectively are combined, with one of the IF signals having a reversed phase relative to the other IF signal, to be supplied to IF first amplifier circuit 116 shown in FIG. 6. VHF.HIGH/LOW switching circuit 112 allows high-frequency signals output from second tuning circuit 110 to be applied to terminals T1 and T2 with phases reversed relative to each other when the VHF.HIGH band is received, and allows high-frequency signals output from second tuning circuit 111 to be applied to terminals T1 and T2 with phases reversed relative to each other when the VHF.LOW band is received.

The resonance frequency of resonant circuit 41 is variably set by tuning voltage applied to terminal T5. When the VHF.HIGH band is received, voltages of a high level and a low level are applied respectively to terminals T6 and T7. When the VHF.LOW band is received, voltages of the low level and the high level are respectively applied to terminals T6 and T7. Accordingly, the variable band of the resonance frequency is changed depending on the VHF.HIGH band and VHF.LOW band.

In cable modem tuner 100, the high-frequency signals supplied via first tuning circuits 103–105, high-frequency amplifier circuits 106–108, and second tuning circuits 109–111 are frequency-converted to IF signals by frequency converter circuits 113 and 114 as described above. In this case, it is desirable that noises generated in the frequency-converting operation are restricted as much as possible. In particular, when local oscillation circuits 52 and 62 are controlled by the PLL, the phase noise generated from local oscillation circuits 52 and 62 respectively deteriorates C/N ratio (Carrier to Noise ratio).

However, in the conventional structure, local oscillation circuit 62 performs the balanced oscillate operation and the feedback capacitors are connected to the collector sides of respective transistors 51 and 52 constituting the differential stage in frequency converter circuit 114 which is common to VHF.HIGH band circuit 202 and VHF.LOW band circuit 203 as illustrated in FIG. 7, so that the collectors of transistors 51 and 52 are inductive for the high-frequency signals. Therefore, when capacitive elements are connected to the collector sides of transistors 51 and 52, a parasitic series resonant circuit is formed, resulting in the so-called trap phenomenon. The trap phenomenon is remarkable especially in the frequency band of the VHF.HIGH band. The parasitic series resonant circuit formed in the trap phenomenon absorbs the power for oscillation, so that oscillation output decreases and the phase noise increases. For this reason, the quality in reception of the VHF.HIGH band is not fine in the conventional cable modem tuner 100.

In addition, the circuit performing the balanced oscillate operation requires a large oscillation power and the local leakage related to an oscillation signal increases. Further, since transistors 51 and 52 constituting the differential stage are required to be formed as the complementarily symmetric type transistors, the stability in oscillation is unsatisfactory. The large number of components associated with the oscillation circuit leads to the poor economy.

SUMMARY OF THE INVENTION

One object of the present invention is to provide a frequency converter circuit for a cable modem tuner having a local oscillation circuit with reduced phase noise to improve quality in reception, and achieving improved local leakage, oscillation stability, and economy.

In order to accomplish the object above, a frequency converter circuit for a cable modem tuner for converting a high-frequency signal received by the cable modem tuner to an intermediate frequency signal in a desired channel is structured as follows.

The frequency converter circuit includes a local oscillation circuit having a resonant circuit, and having a differential amplifier circuit formed of first and second transistors that constitute a differential stage and connected to the resonant circuit. The resonant circuit and the differential amplifier circuit are connected in a manner described below. One end of the resonant circuit is connected to the base of the first transistor via a first capacitive element, and to the collector of the second transistor via a second capacitive element. The other end of the resonant circuit is connected to only the base of the second transistor via a third capacitive element.

According to the manner of connection above, only the second transistor of two transistors constituting the differential stage functions as a transistor for oscillation that performs an oscillate operation using a signal output from the resonant circuit. Therefore, an unbalanced oscillate operation is performed in the local oscillation circuit. As a result, the trap phenomenon due to the conventional balanced oscillate operation does not easily occur so that reduction of the phase noise and improvement of the reception quality are achieved. The unbalanced oscillate operation decreases the oscillation power to reduce the local leakage. The oscillate operation is stabilized since the first and second transistors are not of the complementarily symmetric type. Compared with the conventional circuit performing the balanced oscillate operation, the number of components is reduced since the circuitry associated with connection between the collector side of the first transistor and the resonant circuit is eliminated to improve economy.

In the manner of connection described above, the collector of the first transistor and the collector of the second transistor may be connected and the emitter sides of the first and second transistors may be grounded.

Accordingly, the first transistor operates as an impedance converting transistor that eliminates an impedance unmatched state caused by the fact that the collector side of the second transistor is a high-impedance circuit and the emitter side thereof is a low-impedance circuit. The oscillate operation in the second transistor is thus stabilized.

The resonant circuit described above includes a fourth capacitive element and an inductive element, and the magnitude of inductance of the inductive element is variably set according to a desired channel.

In addition, a high-frequency signal received by the cable modem tuner has a plurality of different frequency bands corresponding to a desired channel.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings. Although the description is applied to a circuit for VHF signals in this embodiment, the description is applicable similarly to a circuit for UHF signals.

Figure 1:
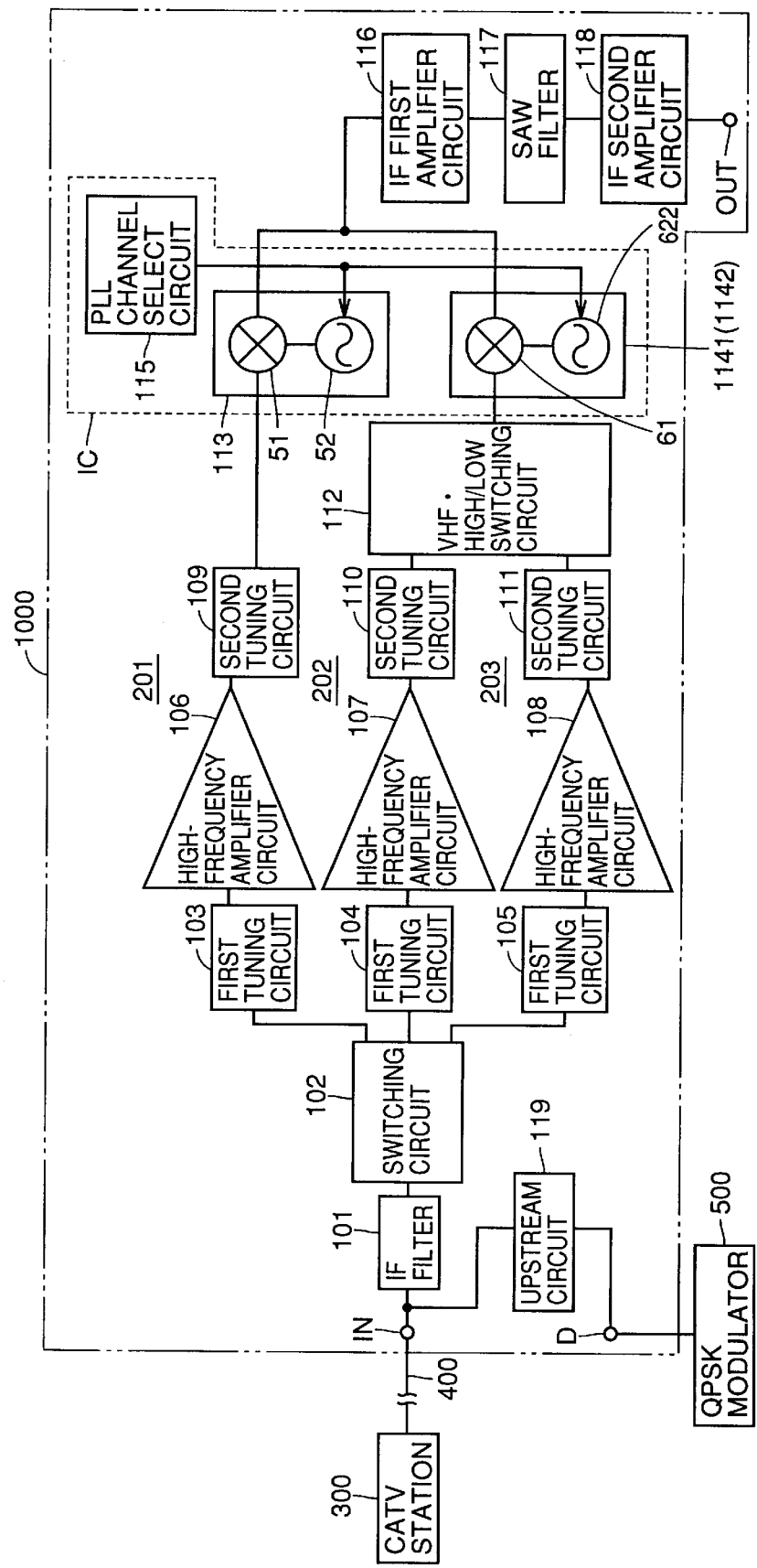
FIG. 1 is a block diagram of a cable modem tuner according to an embodiment of the present invention.
Figure 6:
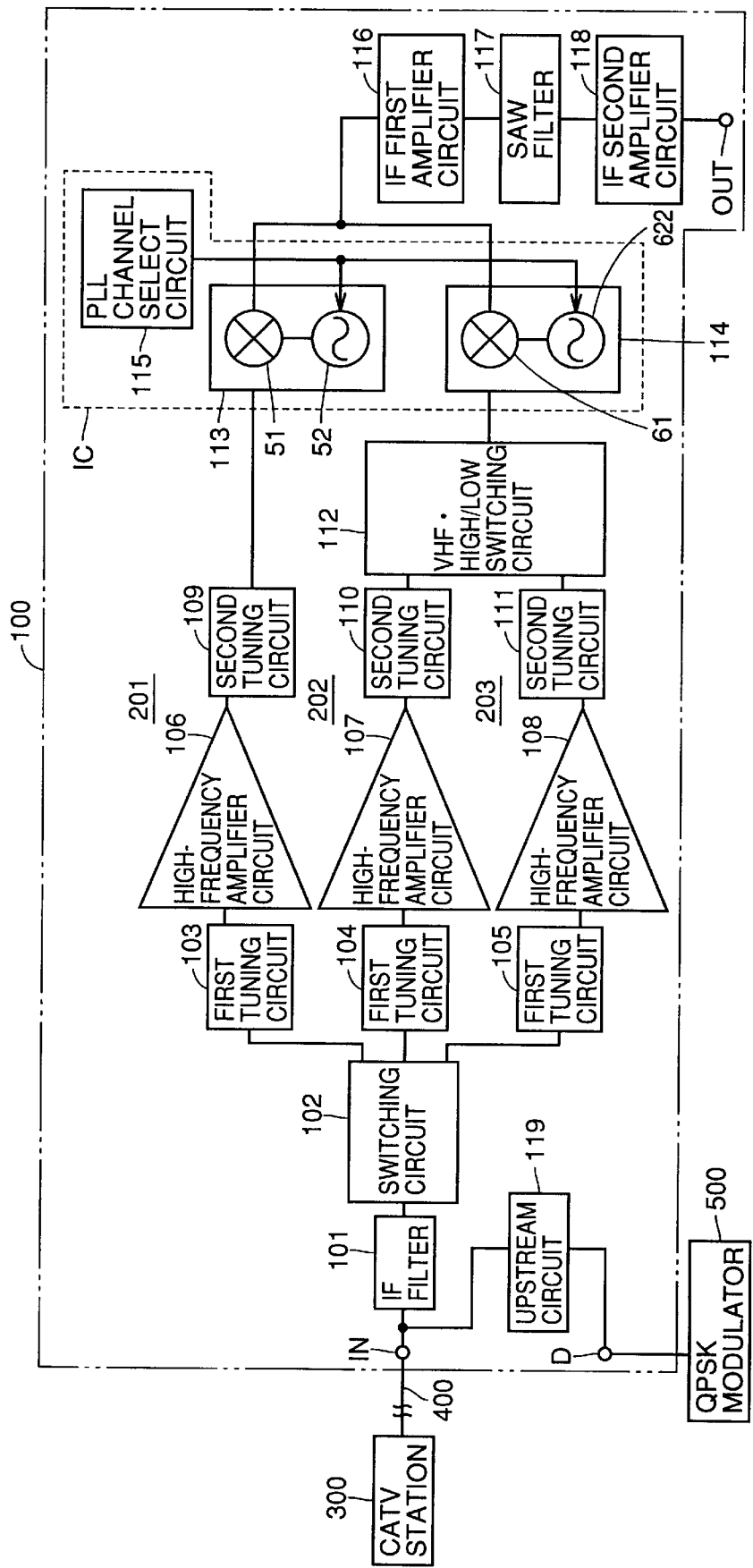
FIG. 6 is a block diagram of the conventional cable modem tuner.
Figure 7:
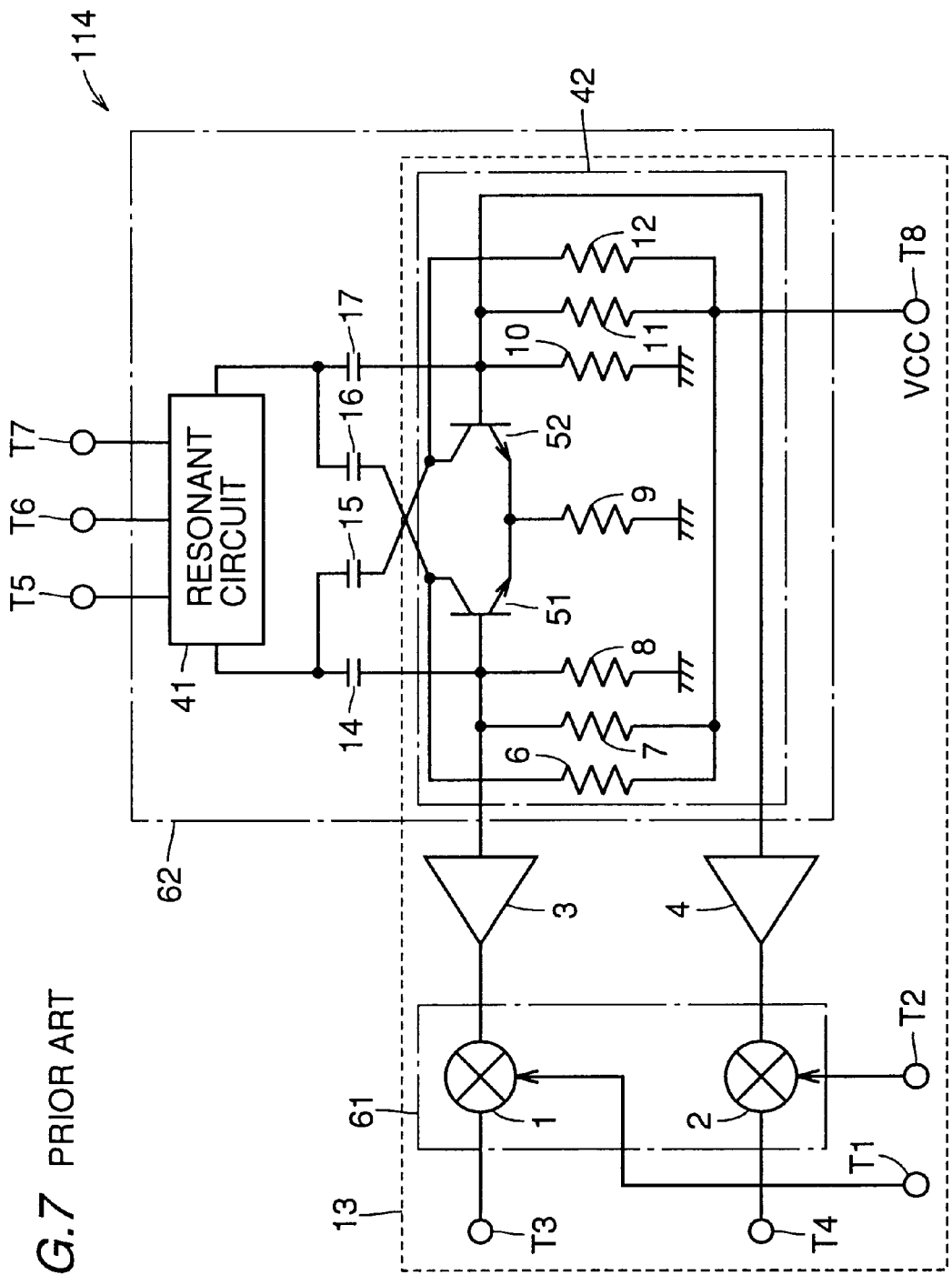
FIG. 7 illustrates a conventional circuit structure of a frequency converter circuit shown in FIG. 6.

A difference between a cable modem tuner 1000 of the embodiment illustrated in FIG. 1 and cable modem tuner 100 illustrated in FIG. 6 is that frequency converter circuit 114 of cable modem tuner 100 is replaced by a frequency converter circuit 1141 (1142). The structure of FIG. 1 except for the difference described above is similar to that of FIG. 6, and description thereof is omitted.

Figure 2:
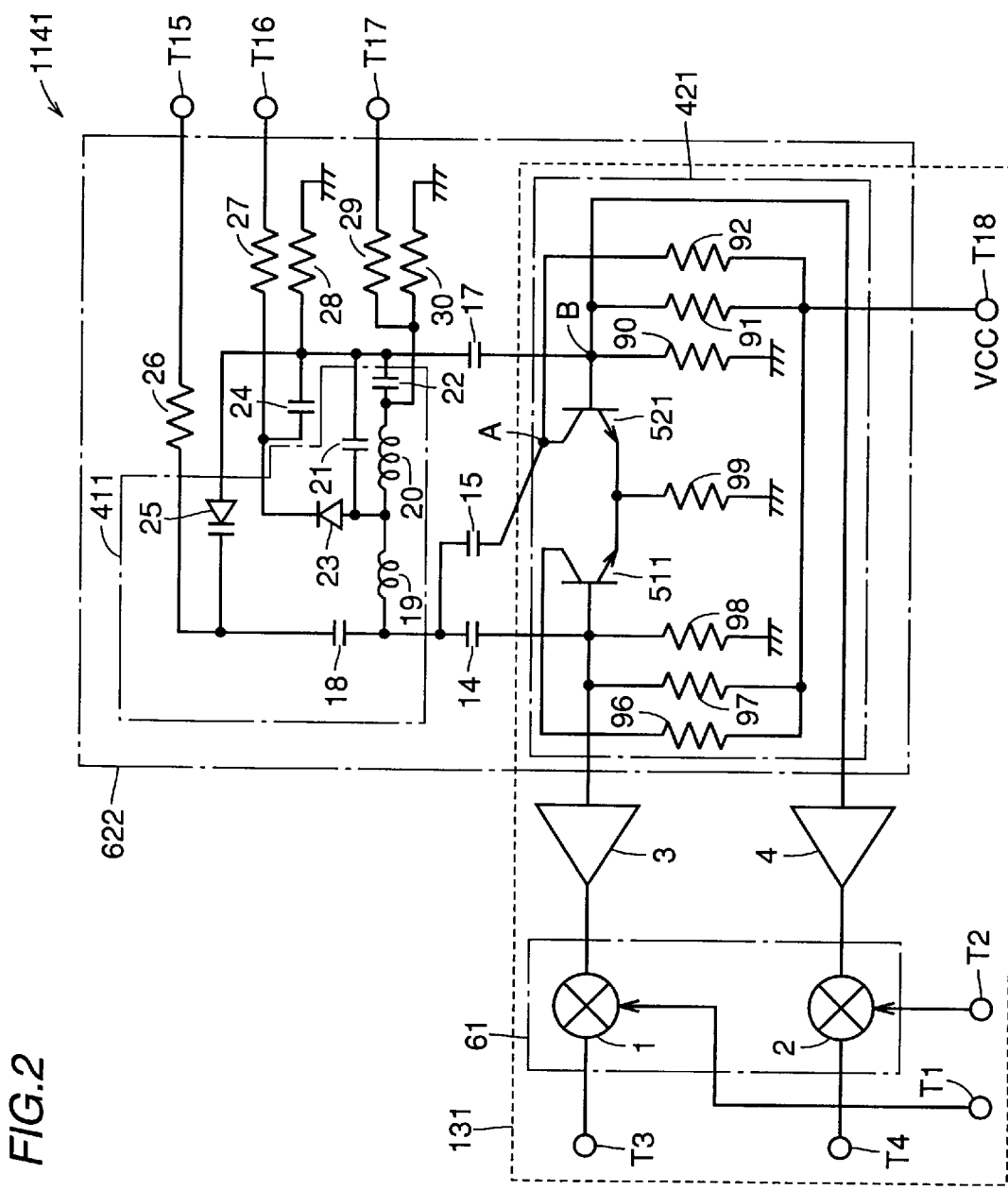
FIG. 2 illustrates a structure of a frequency converter circuit of the cable modem tuner according to the present invention.

FIG. 2 shows a structure of frequency converter circuit 1141. Referring to FIG. 2, frequency converter circuit 1141 includes a mixer circuit 61, buffer amplifiers 3 and 4, a local oscillation circuit 622 connecting terminals T15–T18, and terminals T1–T4.

Mixer circuit 61 includes a mixer circuit 1 connecting input terminal T1 and output terminal T3, and a mixer circuit 2 connecting input terminal T2 and output terminal T4. Mixer circuits 1 and 2 mix oscillation signals respectively generated by local oscillation circuit 622 and supplied from respective buffer amplifiers 3 and 4 of the preceding stage with high-frequency signals supplied from a VHF.HIGH/LOW switching circuit 112 via terminals T1 and T2 respectively for converting them into IF signals, and the IF signals are output from terminals T3 and T4 respectively. The operation in mixer circuit 61 is similar to the conventional operation.

Local oscillation circuit 622 includes a resonant circuit 411, a differential amplifier circuit 421, feedback capacitors 14, 15 and 17, a bypass condenser 24, bias resistors 26 and 28 of a variable capacitance diode 25 described below, and bias resistors 27, 29 and 30 of an SW (abbreviation for switching) diode 23 described below.

Differential amplifier circuit 421 includes transistors 511 and 521 constituting a differential stage, bias resistors 97, 98, 90 and 91, collector resistors 96 and 92, and an emitter resistor 99.

Power supply voltage VCC applied to terminal T18 is divided by bias resistors 90 and 91 to be supplied to the base of transistor 521 which is one of the transistors constituting the differential stage. The collector of transistor 521 is connected to the collector of transistor 511 via bias resistors 92 and 96. The base of transistor 511 is grounded via bias resistor 98. The base of transistor 511 is also connected to the collector side of transistor 511 via bias resistors 96 and 97. Accordingly, when transistor 511 is turned on, the output from the collector side of transistor 511 is fed back to the input of the base side.

Resonant circuit 411 includes a variable frequency control condensers 18 and 22, resonant coils 19 and 20, a tuning condenser 21, SW diode 23, and variable capacitance diode 25. Variable capacitance diode 25 is reverse-biased by voltage (tuning voltage) applied to terminal T15 via bias resistors 26 and 27. By changing the level of the tuning voltage, the resonance frequency of resonant circuit 411 is varied.

SW diode 23 is operated by supplying voltage applied to terminals T16 and T17 via bias resistors 27–30. Bypass condenser 24 is provided for SW diode 23. When the VHF.HIGH band is received, voltages of the low level and the high level are applied to terminals T16 and T17 respectively. When the VHF.LOW band is received, voltages of the high level and the low level are applied to terminals T16 and T17 respectively.

Accordingly, when the VHF-HIGH band is received, SW diode 23 is turned on and the inductance component is only resonant coil 19 in resonant circuit 411. When the VHF.LOW band is received, SW diode 23 is turned off and the inductance components are formed of resonant coils 19 and 20. A variable band of the resonance frequency is changed depending on whether the VHF.HIGH band is received or the VHF.LOW band is received, by change in the magnitude of the inductance in resonant circuit 411.

Resonant circuit 411 and differential amplifier circuit 421 are connected in the manner described below. One end of resonant circuit 411 is connected to the base of transistor 511 via feedback capacitor 14 and to the collector of transistor 521 via feedback capacitor 15. The other end of resonant circuit 411 is connected to only the base of transistor 521 via feedback capacitor 17.

Figure 3:
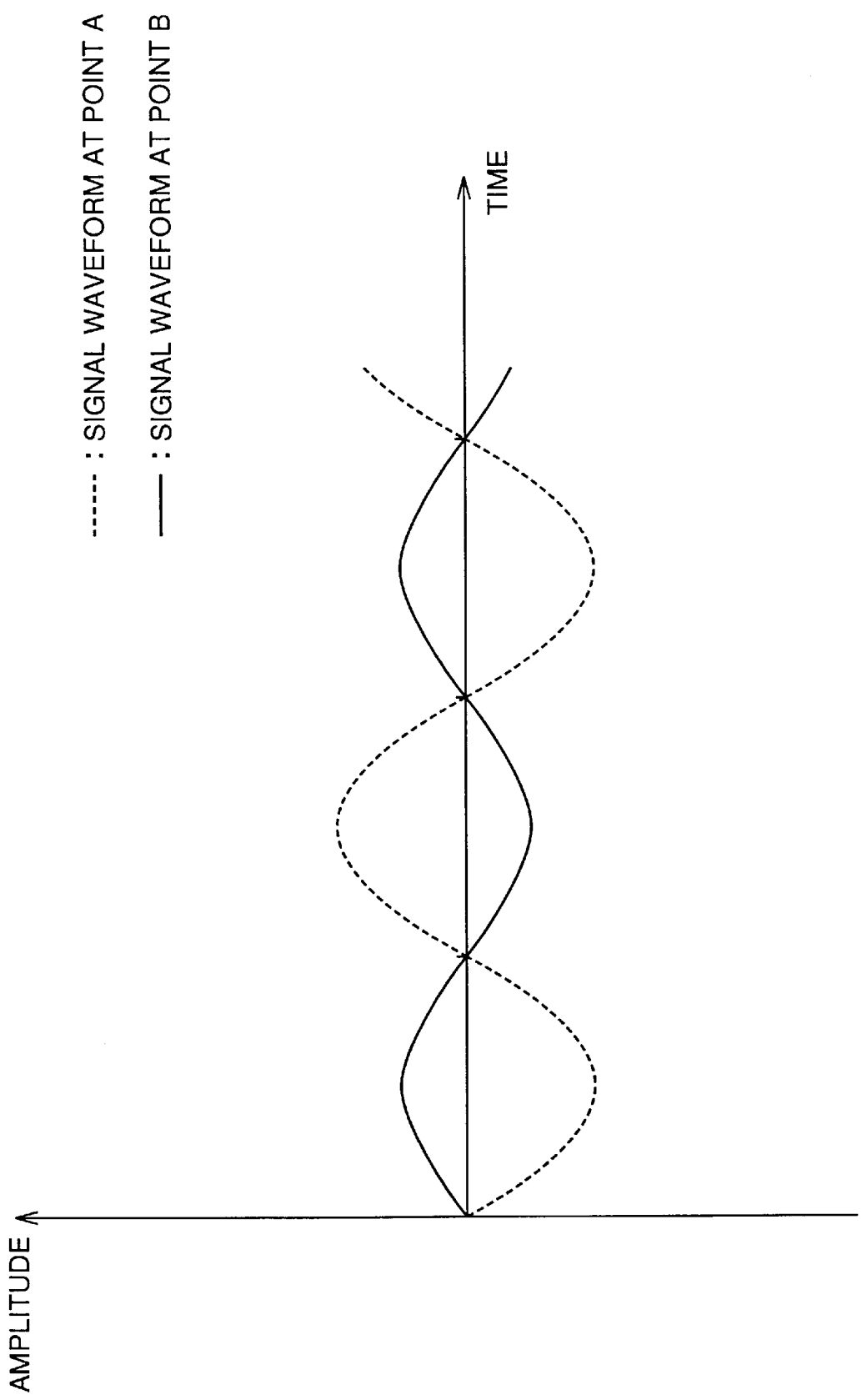
FIG. 3 is a timing chart provided for describing an operation of the frequency converter circuit illustrated in FIG. 2.

An operation of the local oscillation circuit illustrated in FIG. 2 will be described below. Referring to FIG. 3, a waveform of a signal detected at a point A (collector side of transistor 521) and a waveform of a signal detected at a point B (base side of transistor 521) in the operation of the circuit shown in FIG. 2 are illustrated such that they correspond to each other. In operation, the change of the bias voltage upon application of the power supply voltage via terminal T18 causes resonant circuit 411 to oscillate at a resonance frequency according to each voltage level on terminals T15–T17. At this time, transistor 521 operates as an amplifier circuit so that the signals detected at points A and B have phases reversed relative to each other as illustrated in FIG. 3. Specifically, an oscillation signal of resonant circuit 411 generated when the supply voltage is applied is provided to the base side of transistor 521, amplified by transistor 521, and output from the collector side of transistor 521 to a tank circuit formed of variable capacitance diode 25, and resonant coil 19 or 20. The signal output from transistor 521 is passed through the tank circuit with its phase reversed or with the same phase as that of the signal at point B, and supplied to the base side of transistor 521. Therefore, the oscillation signal is further amplified by transistor 521 and the oscillate operation continues. Transistor 511 operates as an impedance converting transistor for impedance-matching relative to transistor 521. In the oscillate operation, the amplitude of the oscillation signal is largest in a tank circuit formed of variable capacitance diode 25, resonant coil 19, variable frequency control condenser 18, and feedback capacitor 14. In other words, the tank circuit is a high-impedance circuit. The emitter side of transistor 521 is a low-impedance circuit in the oscillate operation. Accordingly, an impedance unmatched state occurs in transistor 521 and a normal operation can not be ensured. Therefore, not the feedback capacitor but the collector side of transistor 521 is connected to the collector side of transistor 511 to achieve an impedance matched state of transistor 521. Transistors 521 and 511 constituting the differential stage thus operate respectively as a transistor for oscillation and a transistor for impedance conversion. Accordingly, the oscillate operation of local oscillation circuit 622 is the unbalanced type to avoid the trap phenomenon.

Figure 4:
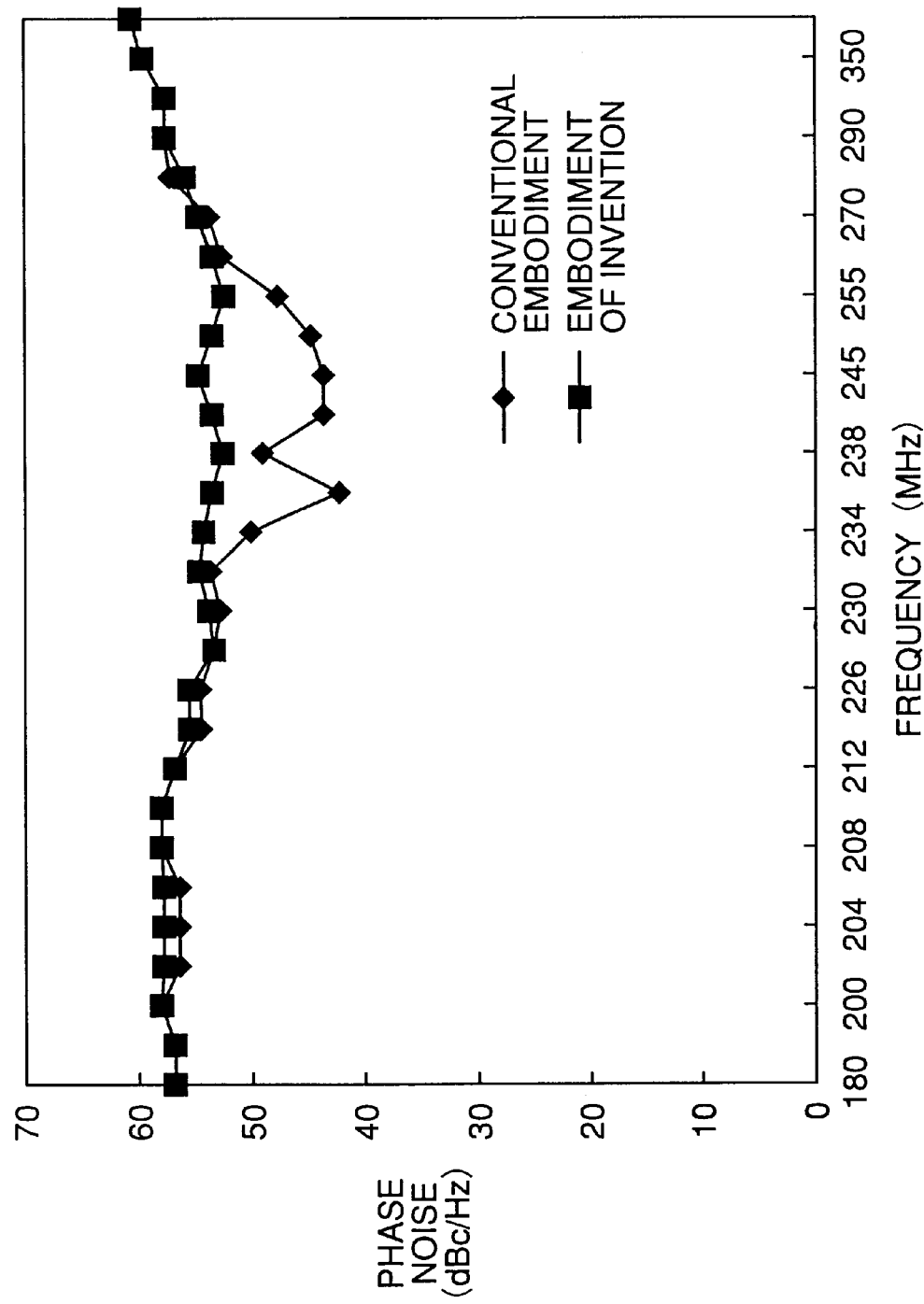
FIG. 4 is a graph showing a result of measurement of C/N ratio relative to each frequency for the conventional cable modem tuner and the cable modem tuner according to the embodiment of the present invention.

As a result, increase of the phase noise due to decrease of the oscillation output of local oscillation circuit 622 is restricted. Compared with the conventional circuit, the C/N ratio doe not deteriorate in a specific reception frequency band as illustrated in FIG. 4 to improve reception quality.

Local oscillation circuit 622 performs the unbalanced oscillate operation. Therefore, the oscillation power decreases, leading to reduction the local leakage. Further, the oscillate operation is stabilized since transistors 511 and 521 constituting the differential stage are not structured as the complementarily symmetric type. Further, the number of components associated with local oscillation circuit 622 and therefore cable modem tuner 1000 is reduced compared with the conventional circuit since the feedback capacitor on the collector side of transistor 511 which is one of the transistors constituting the differential stage is eliminated, leading to an improved economy.

Figure 5:
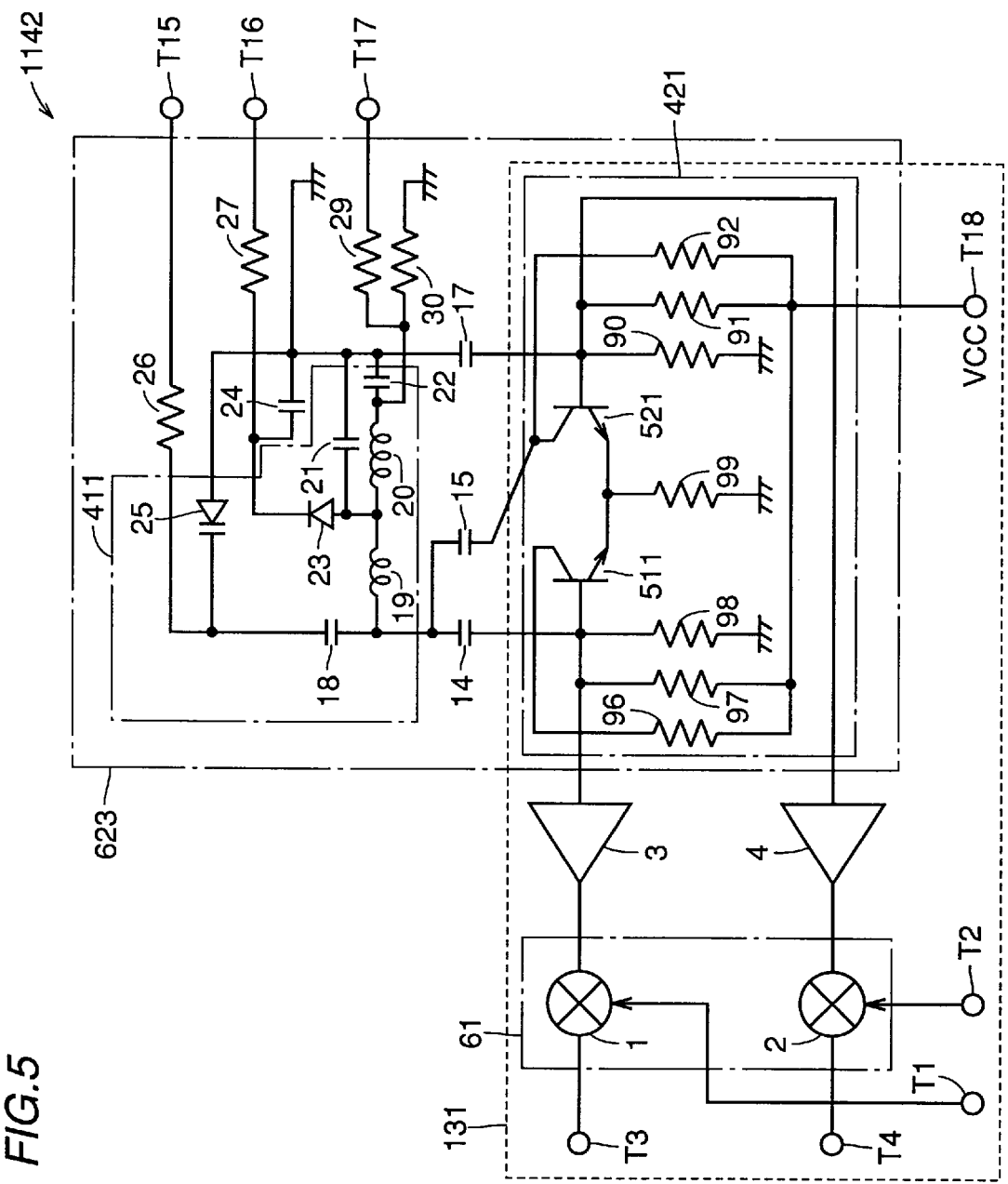
FIG. 5 illustrates another structure of the frequency converter circuit of the cable modem tuner according to the present invention.

Frequency converter circuit 1142 shown in FIG. 5 may be applied to cable modem tuner 1000 shown in FIG. 1. Frequency converter circuit 1142 in FIG. 5 is characterized in that a local oscillation circuit 623 with bias resistor 28 removed is provided that corresponds to local oscillation circuit 622 of frequency converter circuit 1141 in FIG. 2. The structure of frequency converter circuit 1142 except for the structure described above is similar to that illustrated in FIG. 2, and description thereof is omitted. Bias resistor 28 may be eliminated and resonant circuit 411 may be grounded as illustrated in FIG. 5. Accordingly, the number of components associated with local oscillation circuit 623 is reduced since bias resistor 28 is removed, and thus an excellent economy is achieved. Since local oscillation circuit 623 performs the unbalanced oscillate operation, the oscillate operation is ensured even if bias resistor 28 is removed. (In the balanced oscillate operation, the oscillate operation is not performed if bias resistor 28 is removed and resonant circuit 411 is grounded.) However, the local leakage related to an oscillation signal increases. Therefore, this circuit structure is especially effective if measures to cope with the leakage relative to local oscillation circuit 623 are taken.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency converter circuit for cable modem tuner which is provided to a cable modem tuner for converting a high-frequency signal received by said cable modem tuner to an intermediate frequency signal of a desired channel, comprising
    a local oscillation circuit including a resonant circuit, and
        a differential amplifier circuit formed of first and second transistors constituting a differential stage and connected to said resonant circuit, wherein
    one end of said resonant circuit is connected to the base of said first transistor via a first capacitive element and to the collector of said second transistor via a second capacitive element, and the other end of said resonant circuit is connected to only the base of said second transistor via a third capacitive element.

2. The frequency converter circuit for cable modem tuner according to claim 1, wherein the collector of said first transistor is connected to the collector of said second transistor, and emitter sides of said first and second transistors are grounded.

3. The frequency converter circuit for cable modem tuner according to claim 1, wherein
    said resonant circuit includes a fourth capacitive element and an inductive element, and
    a magnitude of inductance of said inductive element is variably set according to said desired channel.

4. The frequency converter circuit for cable modem tuner according to claim 1, wherein said high-frequency signal received by said cable modem tuner has a plurality of different frequency bands corresponding to said desired channel.

* * * * *